(12) United States Patent
Tsukuda et al.

(10) Patent No.: US 12,500,023 B2
(45) Date of Patent: Dec. 16, 2025

(54) CONTROL SYSTEM FOR SEMICONDUCTOR DEVICE

(71) Applicant: Mitsubishi Electric Corporation, Tokyo (JP)

(72) Inventors: Masanori Tsukuda, Tokyo (JP); Kakeru Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 18/413,574

(22) Filed: Jan. 16, 2024

(65) Prior Publication Data

US 2024/0355522 A1    Oct. 24, 2024

(30) Foreign Application Priority Data

Apr. 19, 2023   (JP) ................. 2023-068476

(51) Int. Cl.
*H01F 17/00*   (2006.01)
*H01L 25/16*   (2023.01)
*H03K 17/56*   (2006.01)

(52) U.S. Cl.
CPC ......... *H01F 17/0013* (2013.01); *H01L 25/16* (2013.01); *H03K 17/56* (2013.01); *H01F 2017/002* (2013.01)

(58) Field of Classification Search
CPC ........... H01F 17/0013; H01F 2017/002; H01L 25/16; H03K 17/56
See application file for complete search history.

(56) References Cited

U.S. PATENT DOCUMENTS 5,583,422 A * 12/1996 Schirmer ............ H01F 17/0013
323/224

FOREIGN PATENT DOCUMENTS

JP    2019138847 A   *  8/2019
JP    2020089132 A   *  6/2020
JP    2020-180895 A     11/2020

OTHER PUBLICATIONS

M. Koga, et al.; Application-specific micro Rogowski coil for power modules—Design tool, novel coil pattern and demonstration-; 9th International Conference on Integrated Power Electronics Systems, Mar. 2016.

(Continued)

*Primary Examiner* — Daniel C Puentes
(74) *Attorney, Agent, or Firm* — Studebaker Brackett PLLC

(57) ABSTRACT

According to the present disclosure, a control system for semiconductor device includes a detection unit in which the detection unit is configured with a coil structure, an outgoing path, and a returning path, the coil structure includes a front layer, a back layer, inner side through-vias, and outer side through-vias, the outgoing path and the returning path are provided so as to form a circumference in the front layer or the back layer in plan view, the inner side through-vias and the outer side through-vias are provided at equal intervals along the circumference, one of the outgoing path or the returning path is connected to the inner side through-vias and the outer side through-vias in the front layer and the back layer, and at least portions other than periphery of the inner side through-vias or the outer through-vias overlap in plan view, and an other of the outgoing path or the returning path is provided along one of the outgoing path or the returning path on a side opposite to the coil structure with respect to the inner side through-vias or the outer side through-vias.

12 Claims, 13 Drawing Sheets

(56) References Cited

OTHER PUBLICATIONS

Hasegawa, Kazunori et al.; A New Output Current Measurement Method With Tiny PCB Sensors Capable of Being Embedded in an IGBT Module; IEEE Transactions on Power Electronics; vol. 32, No. 3; Mar. 2017; pp. 1707-1712.

* cited by examiner

F I G. 1
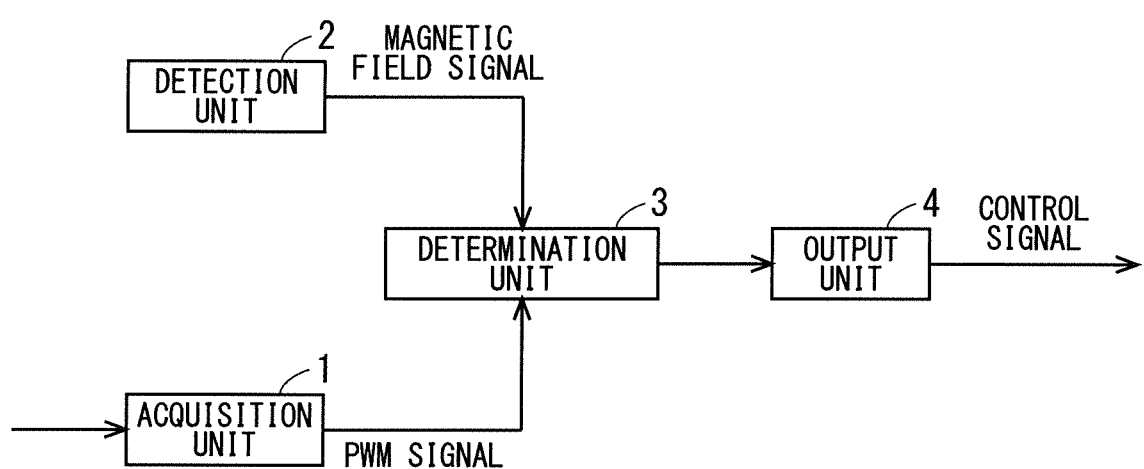

F I G. 4
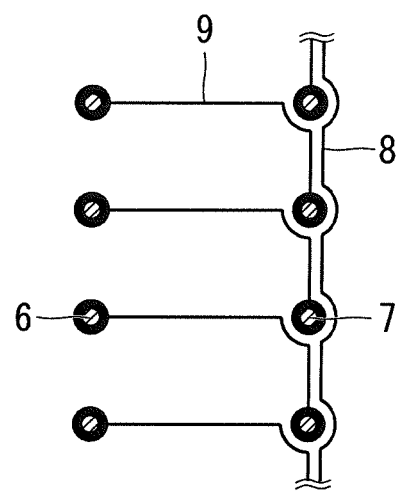

F I G. 6
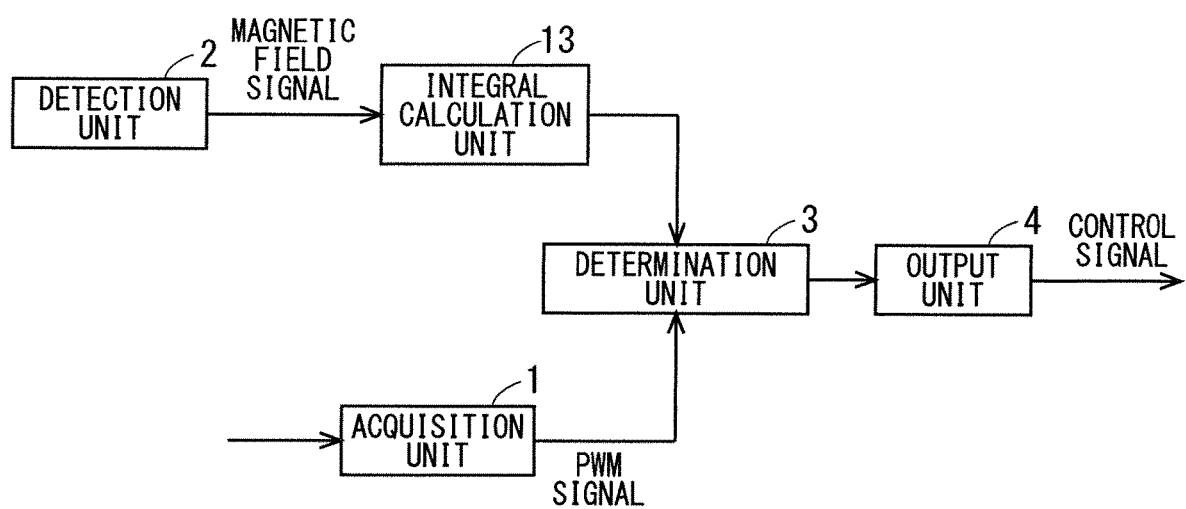

F I G. 1 2

| PWM SIGNAL | ↑ (+) | ↓ (−) | ↑ (+) | ↓ (−) |
|---|---|---|---|---|
| MAGNETIC FIELD SIGNAL | ↓ (−) | ↑ (+) | ↑ (+) | ↓ (−) |
| DETERMINATION | FORWARD CURRENT (IGBT) | | REVERSE CURRENT (Diode) | |

CONTROL SYSTEM FOR SEMICONDUCTOR DEVICE

BACKGROUND OF THE INVENTION

Field of the Invention

The present disclosure relates to a control system for semiconductor device.

Description of the Background Art

Conventionally, as a method of measuring a current flowing through a semiconductor module, a method of incorporating a current sensor chip with a built-in coil into the semiconductor module has been disclosed (for example, see Japanese Patent Application Laid-Open No. 2020-180895).

In Japanese Patent Application Publication No. 2020-180895, there has been a problem that the semiconductor module became large due to a built-in current sensor chip.

SUMMARY

An object of the present disclosure is to provide a control system for semiconductor device that prevents a semiconductor module from increasing in size.

According to the present disclosure, a control system for semiconductor device includes an acquisition unit configured to acquire a Pulse Width Modulation (PWM) signal, a detection unit configured to detect a magnetic field signal of a current flowing through a semiconductor device, a determination unit configured to determine the current flowing through the semiconductor device based on the PWM signal acquired by the acquisition unit and the magnetic field signal detected by the detection unit, and an output unit configured to output a control signal for controlling the semiconductor device based on a determination result of the determination unit, in which the detection unit is configured with a coil structure provided on a double-sided printed circuit substrate, an outgoing path, and a returning path, the coil structure includes a front layer of the double-sided printed circuit substrate, a back layer of the double-sided printed circuit substrate, inner side through-vias and outer side through-vias that extend through the double-sided printed circuit substrate and connect the front layer and the back layer, the outgoing path and the returning path are provided so as to form a circumference in the front layer or the back layer in plan view, the inner side through-vias and the outer side through-vias are provided at equal intervals along the circumference, one of the outgoing path or the returning path is connected to the inner side through-vias and the outer side through-vias in the front layer and the back layer, and at least a portion other than periphery of the inner side through-vias or the outer through-vias overlaps in plan view, and an other of the outgoing path or the returning path is provided along the outgoing path or the returning path on a side opposite to the coil structure with respect to the inner side through-vias or the outer side through-vias.

According to the present disclosure, a semiconductor module is prevented from increase in size.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram illustrating an example of a configuration of a control system for semiconductor device according to Embodiment 1;

FIG. 4 is a plan view illustrating an example of a front layer of the detection unit according to Embodiment 1;

FIG. 6 is a block diagram illustrating an example of a configuration of a control system for semiconductor device according to Embodiment 2;

FIG. 12 is a table for explaining the current determination method based on the PWM signal and the magnetic field signal according to Embodiment 5.

DESCRIPTION OF THE PREFERRED EMBODIMENTS

Embodiment 1

FIG. 1 is a block diagram illustrating an example of a configuration of a control system for semiconductor device according to Embodiment 1. The control system for semiconductor device according to Embodiment 1 includes an acquisition unit 1, a detection unit 2, a determination unit 3, and an output unit 4. Note that a semiconductor device described below is assumed to be an Insulated Gate Bipolar Transistor (IGBT).

The acquisition unit 1 acquires a Pulse Width Modulation (PWM) signal. The PWM signal is a signal used when controlling a semiconductor device (not illustrated).

The detection unit 2 detects a magnetic field signal of a current (collector current) flowing through the semiconductor device. Details of the detection unit 2 will be described later.

The determination unit 3 determines the current flowing through the semiconductor device based on the PWM signal acquired by the acquisition unit 1 and the magnetic field signal detected by the detection unit 2. Specifically, the determination unit 3 determines the direction and magnitude of the current flowing through the semiconductor device.

The output unit 4 outputs a control signal (gate signal) for controlling the semiconductor device based on the determination result of the determination unit 3.

Figure 2:
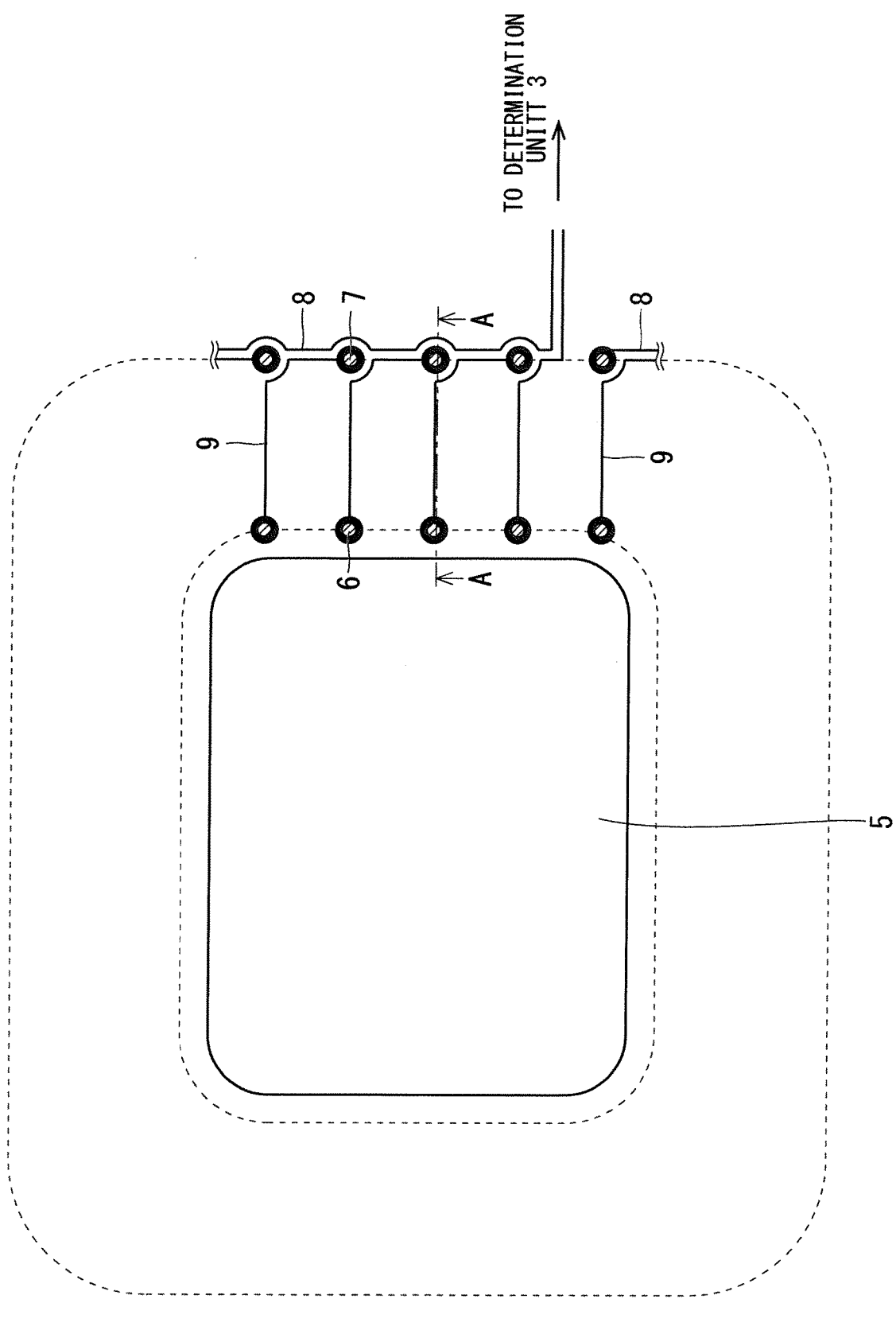
FIG. 2 is a plan view illustrating an example of a configuration of a detection unit according to Embodiment 1.
Figure 3:
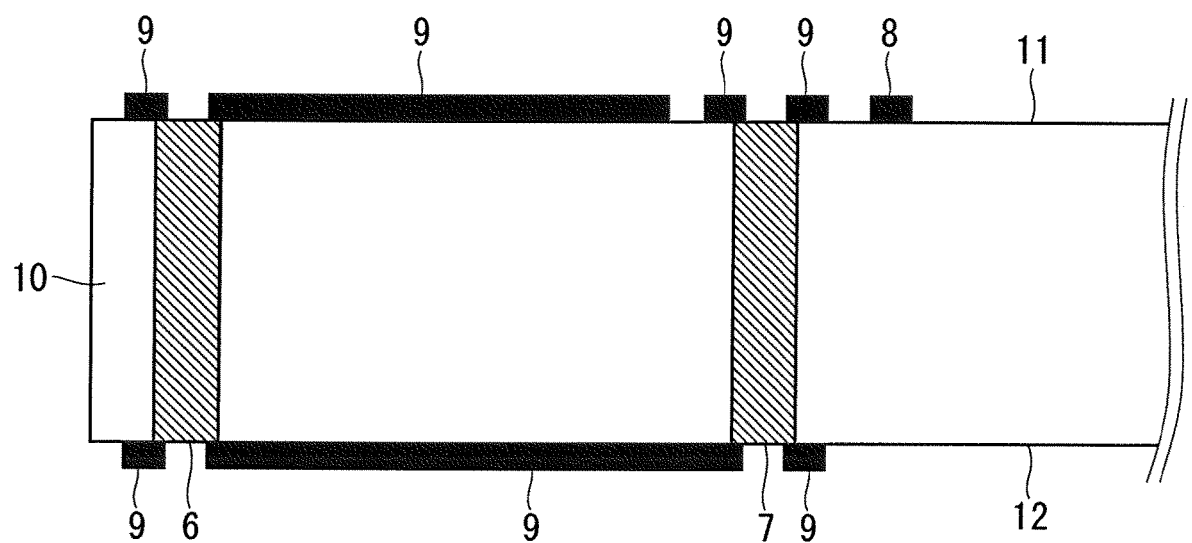
FIG. 3 is a cross-sectional view illustrating an example of a configuration of the detection unit according to Embodiment 1.
Figure 5:
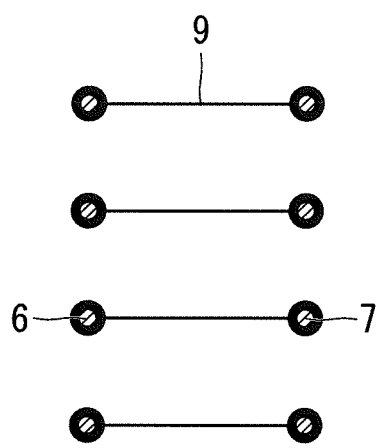
FIG. 5 is a plan view illustrating an example of a back layer of the detection unit according to Embodiment 1.

FIG. 2 is a plan view illustrating an example of a configuration of the detection unit 2 according to Embodiment 1. FIG. 3 is a cross-sectional view illustrating an example of a configuration of the detection unit 2. FIG. 4 is a plan view illustrating an example of a front layer 11 of the detection unit 2. FIG. 5 is a plan view illustrating an example of a back layer 12 of the detection unit 2.

The detection unit 2 is a Rogowski coil configured with a coil structure, an outgoing path 8, and a returning path 9 provided on a double-sided printed circuit substrate 10.

The coil structure includes a front layer 11 of the double-sided printed circuit substrate 10, a back layer 12 of the double-sided printed circuit substrate 10, and inner side through-vias 6 and outer side through-vias 7 that extend through the double-sided printed circuit substrate 10 and connect the front layer 11 and the back layer 12. Further, the double-sided printed circuit substrate 10 has an opening 5, and terminals or wiring are provided so as to pass through the opening 5. A current flowing through the semiconductor device is conducted through the terminals or the wiring.

The inner side through-vias 6 are provided so as to circulate at equal intervals along the opening 5 of the double-sided printed circuit substrate 10. The outer side through-vias 7 are provided so as to circulate the outer side of the inner side through-vias 6 at equal intervals.

In the front layer 11 of the double-sided printed circuit substrate 10, the returning path 9 has one end connected to the inner side through-via 6, and an other end connected to the outer side through-via 7 provided next to the outer side through-via 7 opposite to the inner side through-via 6 (the outer side through-via 7 provided at the closest of the inner through-via 6 to which the one end is connected), (see FIGS. 2, 3, and 4). As illustrated in FIGS. 2 and 4, the returning path 9 includes a straight line going from the inner side through-via 6 to the outer side through-via 7 provided closest of the inner side through-via 6, and a straight line going from the closest-provided outer side through-via 7 to the adjacent outer side through-via 7.

Also, in the back layer 12 of the double-sided printed circuit substrate 10, the returning path 9 has one end connected to the inner side through-via 6, and an other end connected to the outer side through-via 7 opposite to the inner side through-via 6 (the outer side through-via 7 provided at the closest of the inner through-via 6 to which the one end is connected), (see FIGS. 2, 3, and 5).

Parts of the returning path 9 provided in the front layer 11 and the back layer 12 of the double-sided printed circuit substrate 10 overlap in plan view except for the periphery of the outer side through-via 7 (see FIGS. 2 and 3). That is, the returning path 9 is annular in the cross section of the double-sided printed circuit substrate 10, and is a spiral path with the center of the cross section as the axis.

In the front layer 11 of the double-sided printed circuit substrate 10, the outgoing path 8 is provided along the returning path 9 on the side opposite to the coil structure with respect to the outer side through-vias 7 (see FIG. 2). Specifically, the outgoing path 8 is provided along the outside of the outer side through-vias 7. Further, one end of the outgoing path 8 alone is connected to the outer side through-via 7 (see FIG. 2).

As illustrated in FIG. 2, the outgoing path 8 goes around the outside of the outer side through-vias 7 in a counter-clockwise direction and is connected to the outer side through-via 7. Then, the returning path 9 goes around the opening 5 clockwise from the outer side through-via 7 and is drawn out together with the outgoing path 8. In this manner, the outgoing path 8 and the returning path 9 are provided collectively, and both one ends thereof are drawn out. A voltage corresponding to the current flowing through the terminal or wiring provided to pass through the opening 5 is induced at the both drawn-out ends. The induced voltage is a differential signal of the current and corresponds to the magnetic field signal detected by the detection unit 2.

As described above, the Rogowski coil can be established in the double-sided printed circuit substrate 10, which allows the cost to be kept low and prevents the semiconductor module from increasing in size. Further, the returning path 9 is provided at equal intervals, many parts of the returning path 9 overlap in plan view in the front layer 11 and the back layer 12, and the positions of the outgoing path 8 and the returning path 9 are close to each other; therefore, highly accurate detection of the current flowing through the terminal or wiring provided such that it passes through the opening 5 is enabled.

Therefore, according to the control system for semiconductor device according to Embodiment 1, the semiconductor device is optimally controlled in response to the current detected with high accuracy, leading to a significant reduction in loss and high reliability of the semiconductor device.

Further, it becomes possible to apply the control system for semiconductor device according to Embodiment 1 to semiconductor devices equipped with the double-sided gate Reverse Conducting (RC)-IGBT which has gate structures on the front and back sides of the chip which were previously unable to be effectively utilized with conventional gate control despite of being expected to achieve a significant reduction in losses.

Embodiment 2

FIG. 6 is a block diagram illustrating an example of a configuration of a control system for semiconductor device according to Embodiment 2. The control system for semiconductor device according to Embodiment 2 is characterized by including an integral calculation unit 13 provided between the detection unit 2 and the determination unit 3. Other configurations are the same as those of the control system for semiconductor device according to Embodiment 1; therefore, the detail description thereof will be omitted here.

The integral calculation unit 13 performs an integral calculation on the magnetic field signal detected by the detection unit 2. As described above, the magnetic field signal is a differential signal of current. Therefore, when the integral calculation unit 13 integrates the magnetic field signal, the magnetic field signal is converted into a current.

The determination unit 3 determines the current flowing through the semiconductor device based on the signal integrally calculated by the integral calculation unit 13 and the PWM signal acquired by the acquisition unit 1. At this point, since the determination unit 3 uses the signal integrally calculated by the integral calculation unit 13, determination of the magnitude of the current is made easier. Further, since the integral calculation unit 13 performs the integral calculation, fine changes in the magnetic field signal are averaged, and therefore noise included in the magnetic field signal is removed.

Note that the determination unit 3 may use not only the signal integrally calculated by the integral calculation unit 13 but also the magnetic field signal detected by the detection unit 2 to make the determination. In this case, the determination unit 3 determines the current flowing through the semiconductor device based on the signal integrally calculated by the integral calculation unit 13, the magnetic field signal detected by the detection unit 2, and the PWM signal acquired by the acquisition unit 1.

Embodiment 3

Figure 7:
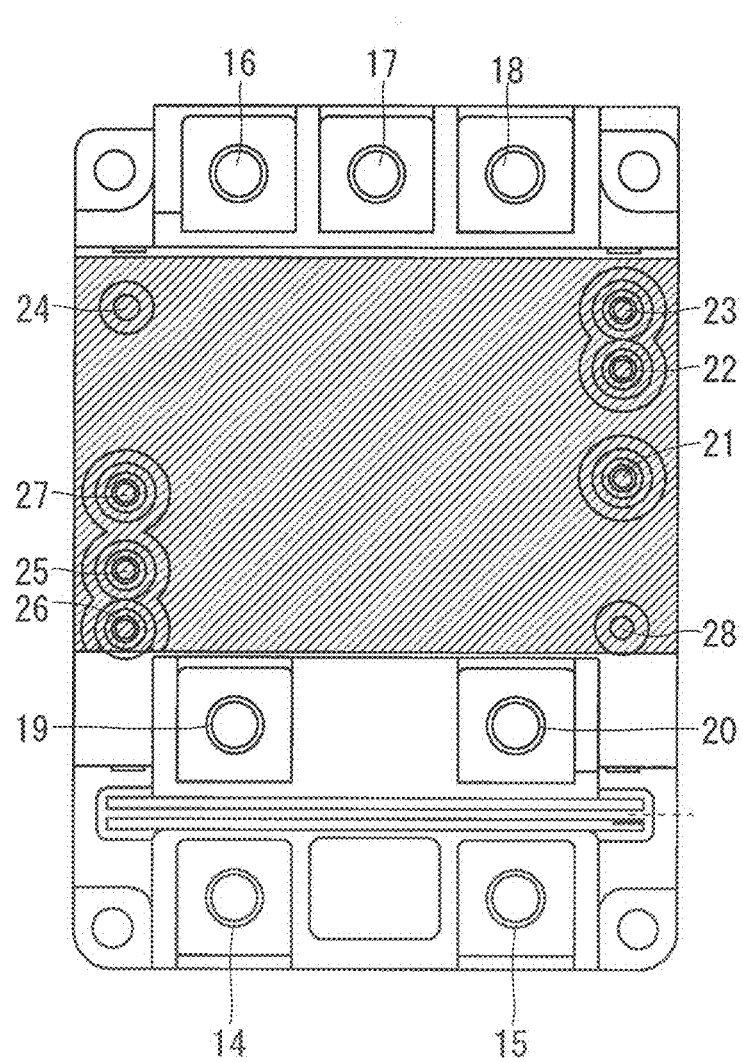
FIG. 7 is a plan view illustrating an example of a combination of a semiconductor module and a gate drive substrate according to the conventional technique.
Figure 8:
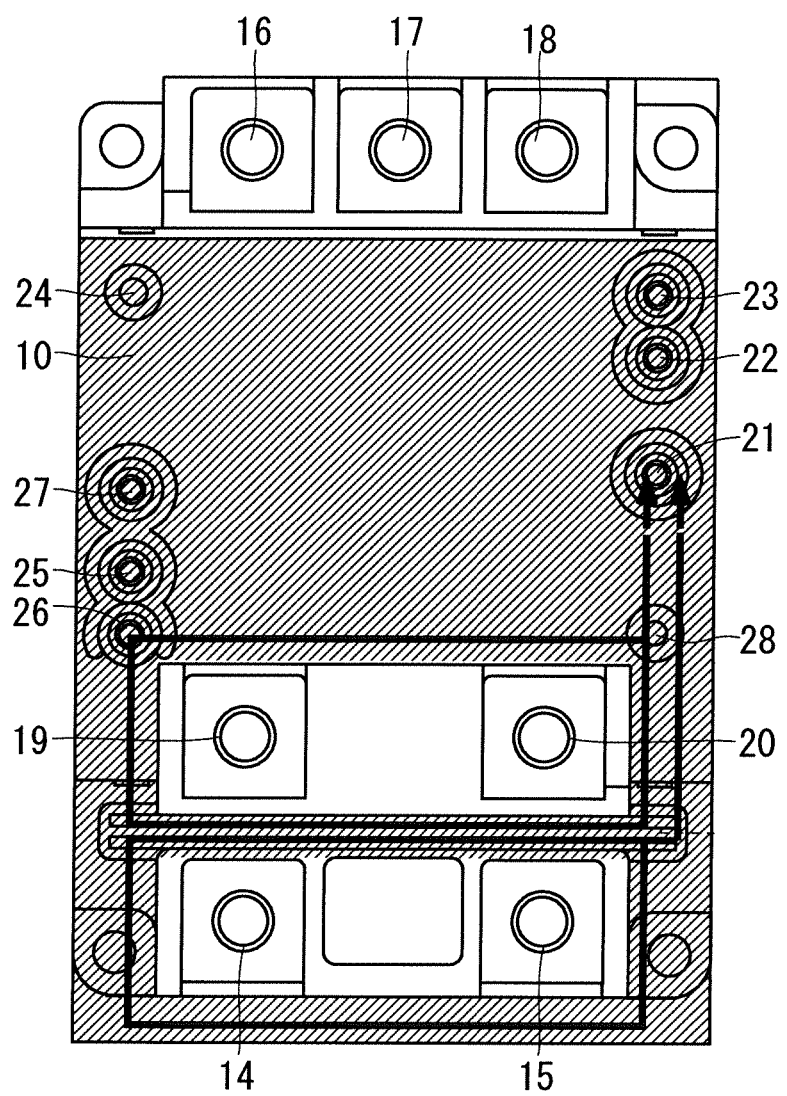
FIG. 8 is a plan view illustrating an example of a combination of a semiconductor module and a gate drive substrate according to Embodiment 3.

FIG. 7 is a plan view illustrating an example of a combination of a semiconductor module and a gate drive substrate according to the conventional technique. FIG. 8 is a plan view illustrating an example of a combination of a semiconductor module and a gate drive substrate according to Embodiment 3. Although the semiconductor modules illustrated in FIGS. 7 and 8 are equipped with an IGBT as a semiconductor device, the semiconductor device is not limited thereto.

In the semiconductor module according to the conventional technique illustrated in FIG. 7, a gate drive substrate (the hatched substrate in the drawing) is provided between DC terminals (high-voltage DC terminals 14, 15 and low-voltage DC terminals 19, 20 illustrated in FIG. 9 described later) and output terminals (output terminals 16, 17, 18 illustrated in FIG. 9 described later).

On the other hand, in the semiconductor module according to Embodiment 3 illustrated in FIG. 8, the double-sided printed circuit substrate 10 having an opening (the opening 5 illustrated in FIG. 2) through which a DC terminal passes is provided. This double-sided printed substrate 10 is the same substrate as the gate drive substrate. That is, the detection unit 2 is formed on the gate drive substrate. With this, the semiconductor device can be controlled without making major changes from the conventional gate drive substrate. Further, by integrating the double-sided printed circuit substrate 10 and the gate drive substrate, handling thereof is made easier, noise is reduced, and reliability is increased.

Embodiment 4

In a control system for semiconductor device according to Embodiment 4 is characterized in that the double-sided printed substrate 10 is a substrate different from the gate drive substrate (not illustrated). That is, the detection unit 2 is formed on a separate substrate different from the gate drive substrate. Other configurations are the same as Embodiment 1 or 2, and description thereof is omitted here.

The above configuration is applied, for example, to a case where a signal from the Rogowski coil built in the semiconductor module is input to the conventional gate drive substrate. If there are restrictions on the shape of the gate drive substrate, using the separate substrates as described above may make the control system for semiconductor device according to the present disclosure applicable. Furthermore, by making the double-sided printed circuit substrate 10 and the gate drive substrate separate, changes from the conventional gate drive substrate can be kept to a minimum.

Embodiment 5

Figure 9:
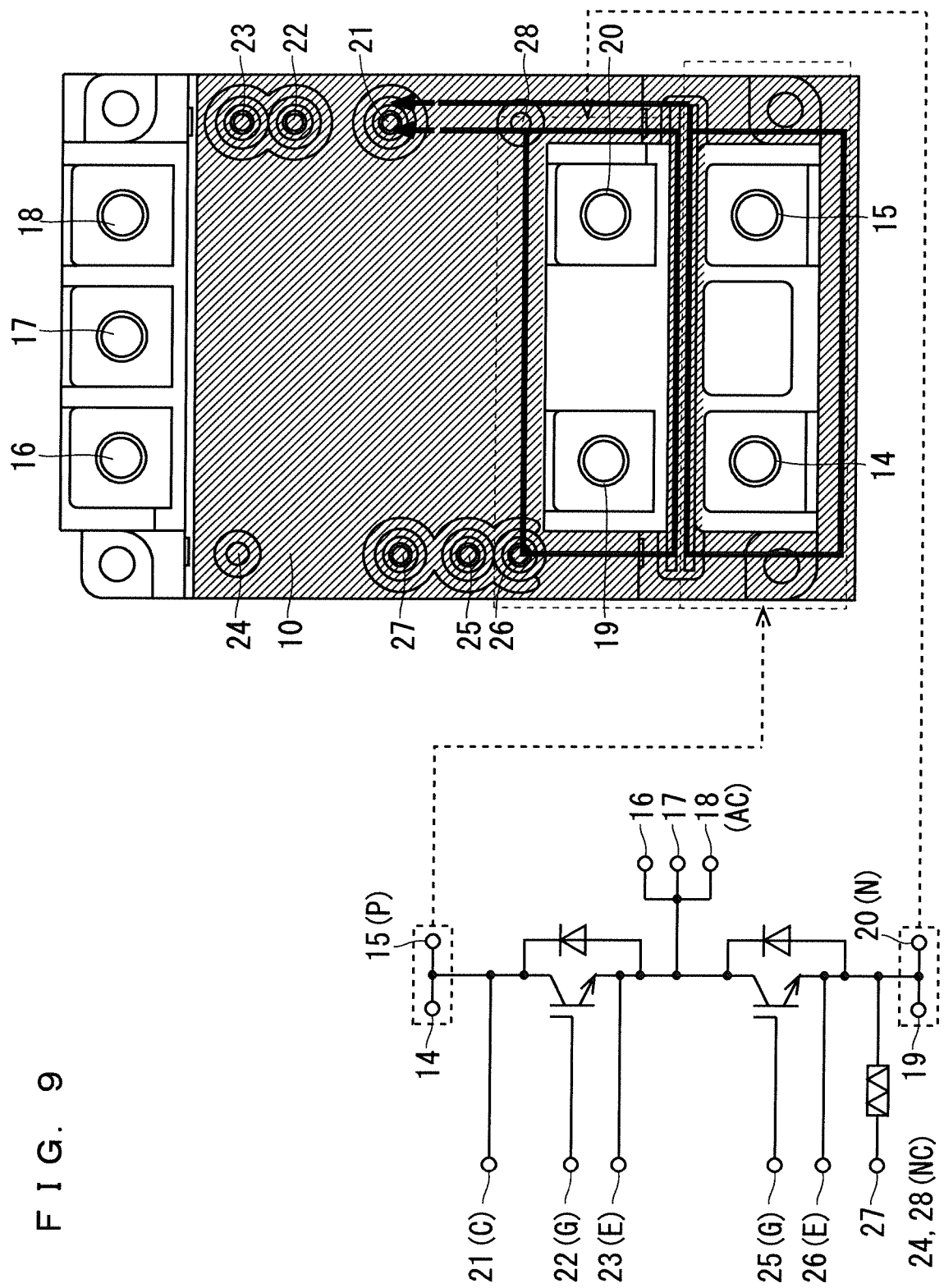
FIG. 9 is a diagram illustrating a relationship between a semiconductor module to which a control system for semiconductor device according to Embodiment 5 is applied and the circuit diagram thereof.

FIG. 9 is a diagram illustrating a relationship between a semiconductor module to which a control system for semiconductor device according to Embodiment 5 is applied and the circuit diagram thereof. FIG. 9 illustrates a case where the semiconductor module is a 2-in-1 module. The semiconductor device includes an IGBT and a diode illustrated in FIG. 9.

As illustrated in FIG. 9, the double-sided printed circuit substrate 10 has openings (the opening 5 illustrated in FIG. 1) through which the high-voltage DC terminals 14, 15 and the low-voltage DC terminals 19, 20 pass, respectively. The detection unit 2 is formed to surround each opening (see FIGS. 2 to 5). With this configuration, the detection unit 2 is magnetically coupled to each of the high-voltage DC terminals 14, 15 and the low-voltage DC terminals 19, 20. The current flowing through each of the high-voltage DC terminals 14, 15 and the low-voltage DC terminals 19, 20 is in pulse form, generating larger magnetic field signals than those from the output terminals 16, 17, 18. Therefore, this allows the detection unit 2 to detect the magnetic field signal easily.

Although FIG. 9 illustrates the case where each of the high-voltage DC terminals 14, 15 and the low-voltage DC terminals 19, 20 pass through the opening of the double-sided printed circuit substrate 10, it may be adoptable that the conductors (wiring) connected to the high-voltage DC terminals 14, 15 and the low-voltage DC terminal 19, 20 may pass through the openings, respectively, in the double-sided printed circuit substrate 10.

Figure 10:
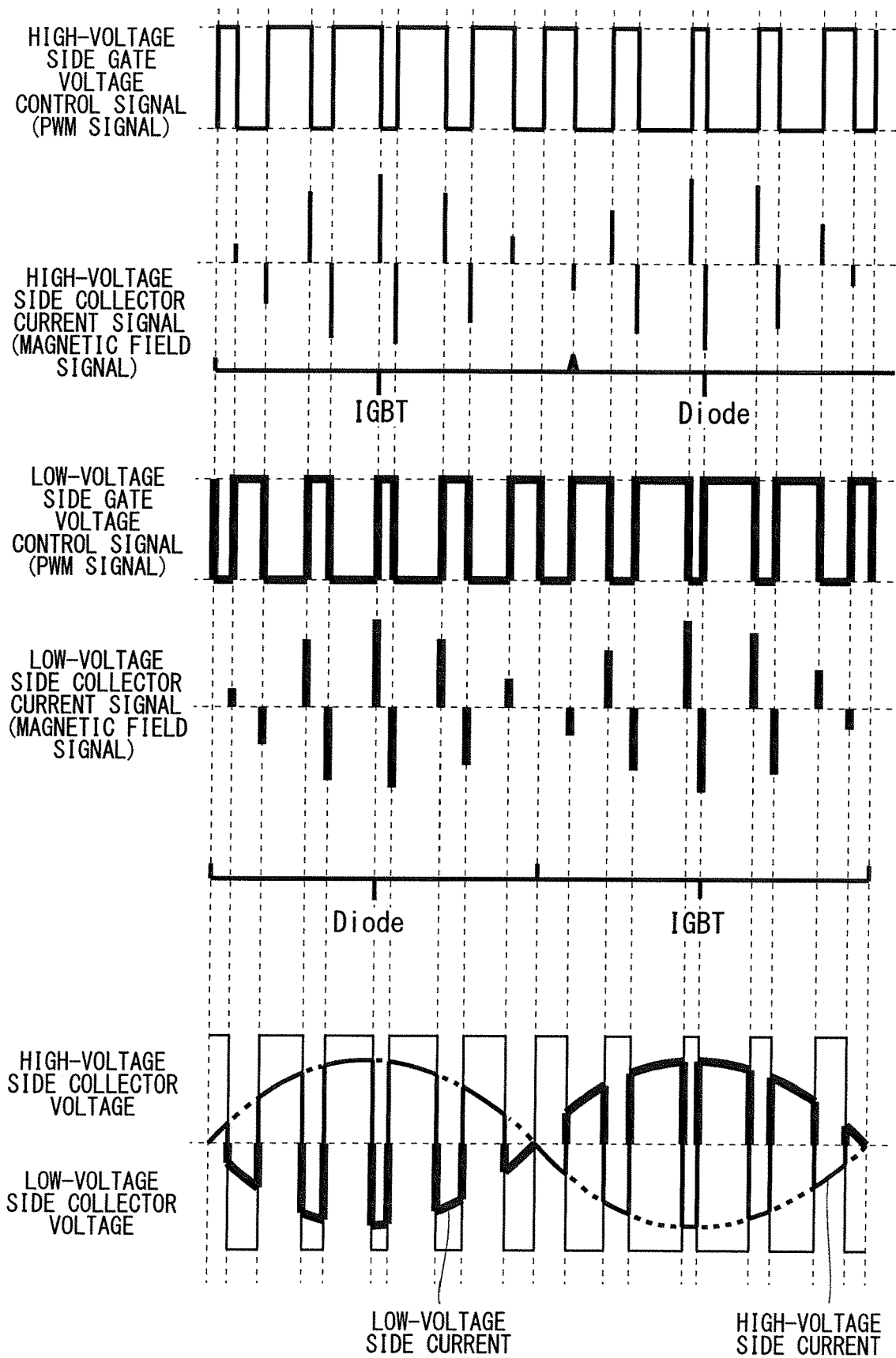
FIG. 10 is a diagram for explaining a current determination method based on a PWM signal and a magnetic field signal according to Embodiment 5.
Figure 11:
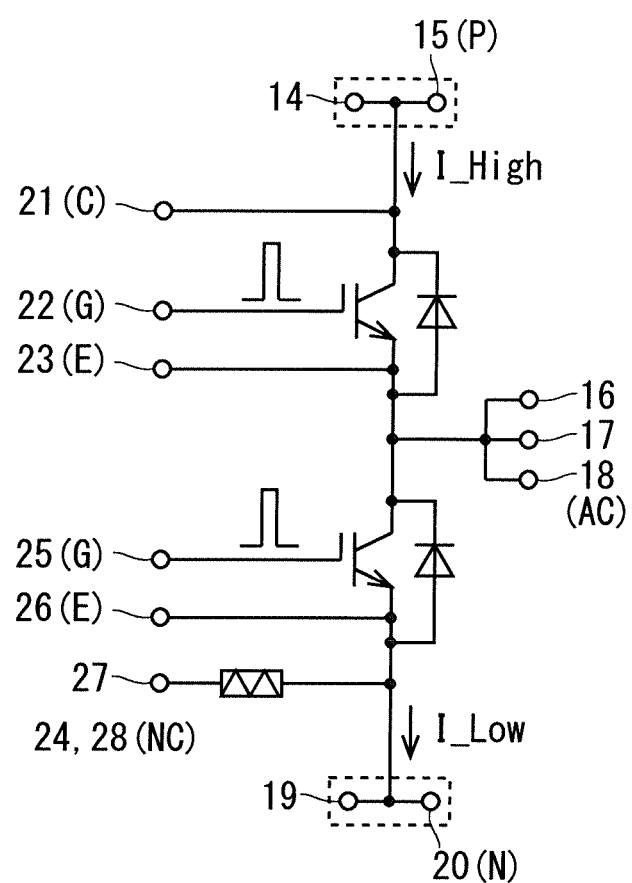
FIG. 11 is a diagram for explaining the current determination method based on the PWM signal and the magnetic field signal according to Embodiment 5.

FIGS. 10 to 12 are diagrams for describing a current determination method based on a PWM signal and a magnetic field signal according to Embodiment 5.

As illustrated in FIG. 10, referring to the PWM signal (high-voltage side gate voltage control signal, low-voltage side gate voltage control signal) and the magnetic field signal (high-voltage side collector current signal, low-voltage side collector current signal) at the same arbitrary timing, in the operation of the IGBT, the changes in the PWM signal and the magnetic field signal are opposite, and it can be seen that current is flowing through the IGBT at this timing.

On the other hand, referring to the PWM signal (high-voltage side gate voltage control signal, low-voltage side gate voltage control signal) and the magnetic field signal (high-voltage side collector current signal, low-voltage side collector current signal) at the same arbitrary timing, in the operation of the diode, the changes in the PWM signal and the magnetic field signal are the same, and it can be seen that current is flowing through the diode at this timing.

As described above, the determination unit 3 determines the direction and magnitude of the current flowing through the semiconductor device. That is, as illustrated in FIG. 12, the determination unit 3 determines that a forward current is flowing through the semiconductor device (IGBT) when the changes in the PWM signal and the magnetic field signal are opposite, and determines that a reverse current is flowing through the semiconductor device (diode) when the PWM signal and the magnetic field signal are the same.

Modification of Embodiment 5

Figure 13:
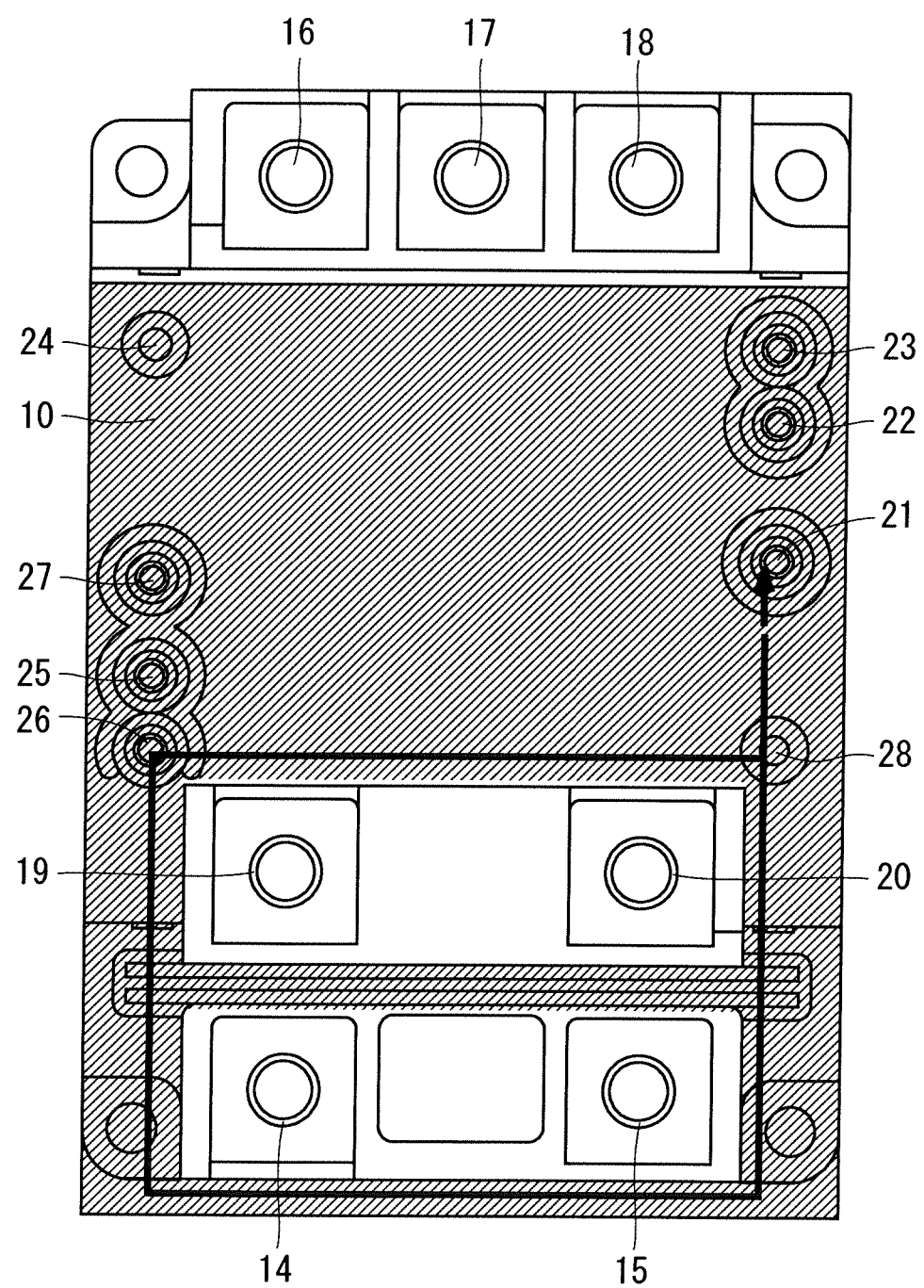
FIG. 13 is a plan view illustrating an example of a combination of the semiconductor module and the gate drive substrate according to modification of Embodiment 5.

FIG. 13 is a plan view illustrating an example of the combination of the semiconductor module and the gate drive substrate according to Embodiment 5.

There is a case where the high-voltage DC terminals 14, 15 and the low-voltage DC terminals 19, 20 are too close to each other to form a Rogowski coil (detection unit 2) in each of the high-voltage DC terminals 14, 15 and the low-voltage DC terminals 19, 20. In such a case, as illustrated in FIG. 13, one Rogowski coil may be formed for the high-voltage DC terminals 14, 15 and the low-voltage DC terminals 19, 20 collectively. Specifically, the Rogowski coil is formed around the high-voltage DC terminals 14, 15 and the low-voltage DC terminals 19, 20 combined.

With the above configuration, while it becomes easier to form the Rogowski coil and the signal strength increases, it made it difficult to separate the currents of the IGBT and the diode.

Embodiment 6

Embodiment 6 is characterized in that the semiconductor module is a 6-in-1 module. Other configurations are the same as Embodiment 5, and description thereof is omitted here.

When the semiconductor module is a 6-in-1 module, the detection unit 2 detects the magnetic field signal of the current flowing through the DC terminal with the highest signal strength.

Embodiment 7

In Embodiment 7, an application example in which high effects can be obtained when using the control system for semiconductor device according to the present disclosure will be described.

<Case of Semiconductor Device Using RC-IGBT>

In the RC-IGBT, during diode operation, it is desirable that the gate be in an off state to promote hole injection. Further, before reverse recovery of the diode, the gate is preferably in an on state (no dead time) in order to suppress hole injection.

However, the conventional control system for semiconductor device is unable to determine whether current is flowing through the IGBT or the diode, and therefore the ideal gate control as described above cannot be performed. In other words, in the conventional control system for semiconductor device, the situation was the exact opposite of the ideal gate control in which the gate is in an on state to suppress hole injection during diode operation, and the gate is in an off state to promote hole injection before the diode recovers.

The control system for semiconductor device according to the present disclosure can detect whether a current is flowing through the IGBT or the diode, and can detect the timing of a change in the current. Therefore, ideal gate control as described above is ensured.

As for the methods to shorten the dead time, there are a method using the magnetic field signal at the timing of the gate signal, and a method in which the dead time is set shorter than that of the conventional method, and the magnetic field signal is used as a protection signal should a short circuit occur.

<Case of Semiconductor Device Using Double-Sided Gate RC-IGBT>

A double-sided gate RC-IGBT can share the current path between the IGBT and the diode, which allows the miniaturization of the chip, and by instantly reducing holes, IGBT turn-off loss and diode reverse recovery loss can be significantly reduced.

However, in the case of the double-sided gate RC-IGBT, while the IGBT operates when the front gate is in the on state and the back gate is in the off state, the diode operates when the front gate is in the off state and the back gate is in the on state, which requires opposite gate control, hampering effective utilization of the double-sided gate RC-IGBT by the conventional gate control.

The control system for semiconductor device according to the present disclosure detects the direction and magnitude of a current and the timing of changes in the current, this allows the use of a gate control pattern in response to the current and minimization of dead time. That is, according to the control system for semiconductor device according to the present disclosure, the gate control of a semiconductor module equipped with a double-sided gate RC-IGBT is enabled.

<Case of Semiconductor Device Using SiC-Metal Oxide Semiconductor Field Effect Transistor (MOSFET)>

Originally, SiC-MOSFETs can use built-in diodes (bipolar diodes) or synchronous rectification diodes on their own. However, during diode operation or during dead times, bipolar operation can lead to the spreading of crystal defects, increased losses, and in the worst-case scenario, even result in destruction of the SiC-MOSFET. Therefore, countermeasures have been taken in SiC-MOSFETs, such as providing an external diode or incorporating a Schottky barrier diode.

In the control system for semiconductor device according to the present disclosure, by eliminating or minimizing dead time, the expansion of defects may potentially be suppressed to a range with no adverse effect.

<Other Example of Semiconductor Device>

Examples of semiconductor devices other than those exemplified above include single-gate IGBTs, gated diodes, multi-gate IGBTs, multi-gate RC-IGBTs, and the like.

Even when these semiconductor devices are applied to the control system for semiconductor device according to the present disclosure, the use of a gate control pattern in response to the current and minimization of dead time leads to a significant reduction in loss.

It should be noted that Embodiments of the present disclosure can be arbitrarily combined and can be appropriately modified or omitted without departing from the scope of the invention.

APPENDIX

Hereinafter, the aspects of the present disclosure will be collectively described as Appendices.

Appendix 1

A control system for semiconductor device comprising:
an acquisition unit configured to acquire a Pulse Width Modulation (PWM) signal;
a detection unit configured to detect a magnetic field signal of a current flowing through a semiconductor device;
a determination unit configured to determine the current flowing through the semiconductor device based on the PWM signal acquired by the acquisition unit and the magnetic field signal detected by the detection unit; and
an output unit configured to output a control signal for controlling the semiconductor device based on a determination result of the determination unit, wherein
the detection unit is configured with a coil, an outgoing path, and a returning path structure provided on a double-sided printed circuit substrate,
the coil structure includes a front layer of the double-sided printed circuit substrate, a back layer of the double-sided printed circuit substrate, and inner side through-vias and outer side through-vias that extend through the double-sided printed circuit substrate and connect the front layer and the back layer, the outgoing path and the returning path are provided so as to form a circumference in the front layer or the back layer in plan view, the inner side through-vias and the outer side through-vias are provided at equal intervals along the circumference, one of the outgoing path or the returning path is connected to the inner side through-vias and the outer side through-vias in the front layer and the back layer, and at least portions other than periphery of the inner side through-vias or the outer through-vias overlap in plan view, and an other of the outgoing path or the returning path is provided along one of the outgoing path or the returning path on a side opposite to the coil structure with respect to the inner side through-vias or the outer side through-vias.

Appendix 2

The control system for semiconductor device according to Appendix 1, further comprising
an integral calculation unit configured to perform an integral calculation on the magnetic field signal detected by the detection unit, wherein
the determination unit is configured to determine a current flowing through the semiconductor device based on a signal integrally calculated by the integral calculation unit and the PWM signal acquired by the acquisition unit.

Appendix 3

The control system for semiconductor device according to Appendix 1 or 2, wherein
the double-sided printed substrate is a same substrate as a gate drive substrate.

Appendix 4

The control system for semiconductor device according to Appendix 1 or 2, wherein
the double-sided printed substrate is a different substrate from a gate drive substrate.

Appendix 5

The control system for semiconductor device according to any one of Appendices 1 to 4, wherein
the detection unit is magnetically coupled to DC terminals of a 2-in-1 module or conductors connected to the DC terminals.

Appendix 6

The control system for semiconductor device according to any one of Appendices 1 to 4, wherein
the detection unit is magnetically coupled to DC terminals of a 6-in-1 module or conductors connected to the DC terminals.

Appendix 7

The control system for semiconductor device according to any one of Appendices 1 to 6, wherein
the semiconductor device is any one of a multi-gate Insulated Gate Bipolar Transistor (IGBT), a gated diode, a Reverse Conducting (RC)-IGBT, a multi-gate RC-IGBT, and a SiC-Metal Oxide Semiconductor Field Effect Transistor (MOSFET).

While the invention has been illustrated and described in detail, the foregoing description is in all aspects illustrative and not restrictive. It is therefore understood that numerous modifications and variations can be devised without departing from the scope of the invention.

What is claimed is:

1. A control system for a semiconductor device, the control system comprising a driver comprising a coil structure, an outgoing path, and a returning path each provided on a double-sided printed circuit substrate, the driver being configured to:

acquire a Pulse Width Modulation (PWM) signal;

detect, by the coil structure, the outgoing path, and the returning path provided on the double-sided printed circuit substrate, a magnetic field signal of a current flowing through the semiconductor device;

determine the current flowing through the semiconductor device based on the acquired PWM signal and the detected magnetic field signal; and output a control signal for controlling the semiconductor device based on the determined current, wherein the coil structure includes a front layer of the double-sided printed circuit substrate, and a back layer of the double-sided printed circuit substrate, and inner side through-vias and outer side through-vias that extend through the double-sided printed circuit substrate and connect the front layer and the back layer, the outgoing path and the returning path are provided so as to form a circumference in the front layer or the back layer in plan view, the inner side through-vias and the outer side through-vias are provided at equal intervals along the circumference, one of the outgoing path or the returning path is connected to the inner side through-vias and the outer side through-vias in the front layer and the back layer, and at least portions of the one of the outgoing path or the returning path positioned between the inner side through-vias and the outer side through-vias overlap in plan view, and an other of the outgoing path or the returning path is provided along one of the outgoing path or the returning path on a side opposite to the coil structure with respect to the inner side through-vias or the outer side through-vias.

2. The control system for the semiconductor device according to claim 1, wherein
the double-sided printed circuit substrate is a same substrate as a gate drive substrate.

3. The control system for the semiconductor device according to claim 1, wherein
the double-sided printed circuit substrate is a different substrate from a gate drive substrate.

4. The control system for the semiconductor device according to claim 1, wherein
the coil structure is magnetically coupled to DC terminals of a 2-in-1 module or conductors connected to the DC terminals.

5. The control system for the semiconductor device according to claim 1, wherein
the coil structure is magnetically coupled to DC terminals of a 6-in-1 module or conductors connected to the DC terminals.

6. A system comprising the semiconductor device and the control system for the semiconductor device according to claim 1, wherein the semiconductor device is any one of a multi-gate Insulated Gate Bipolar Transistor (IGBT), a gated diode, a Reverse Conducting (RC)-IGBT, a multi-gate RC-IGBT, and a SiC-Metal Oxide Semiconductor Field Effect Transistor (MOSFET).

7. The control system for the semiconductor device according to claim 1, wherein the driver is further configured to:
perform an integral calculation on the detected magnetic field signal, and
determine the current flowing through the semiconductor device based on the integrally calculated signal and the acquired PWM signal.

8. The control system for the semiconductor device according to claim 7, wherein
the double-sided printed circuit substrate is a same substrate as a gate drive substrate.

9. The control system for the semiconductor device according to claim 7, wherein
the double-sided printed circuit substrate is a different substrate from a gate drive substrate.

10. The control system for the semiconductor device according to claim 7, wherein
the coil structure is magnetically coupled to DC terminals of a 2-in-1 module or conductors connected to the DC terminals.

11. The control system for the semiconductor device according to claim 7, wherein
the coil structure is magnetically coupled to DC terminals of a 6-in-1 module or conductors connected to the DC terminals.

12. A system comprising the semiconductor device and the control system for the semiconductor device according to claim 7, wherein
the semiconductor device is any one of a multi-gate Insulated Gate Bipolar Transistor (IGBT), a gated diode, a Reverse Conducting (RC)-IGBT, a multi-gate RC-IGBT, and a SiC-Metal Oxide Semiconductor Field Effect Transistor (MOSFET).

* * * * *